United States Patent
Zhao

(10) Patent No.: US 10,283,134 B2
(45) Date of Patent: May 7, 2019

(54) SOUND-MIXING PROCESSING METHOD, APPARATUS AND DEVICE, AND STORAGE MEDIUM

(71) Applicant: GUANGZHOU KUGOU COMPUTER TECHNOLOGY CO., LTD., Guangzhou, Guangdong (CN)

(72) Inventor: Weifeng Zhao, Guangdong (CN)

(73) Assignee: GUANGZHOU KUGOU COMPUTER TECHNOLOGY CO., LTD., Guangzhou, Guangdong (CN)

(*) Notice: Subject to any disclaimer, the term of this patent is extended or adjusted under 35 U.S.C. 154(b) by 0 days.

(21) Appl. No.: 15/761,745

(22) PCT Filed: Jun. 3, 2016

(86) PCT No.: PCT/CN2016/084718
§ 371 (c)(1),
(2) Date: Mar. 20, 2018

(87) PCT Pub. No.: WO2017/054494
PCT Pub. Date: Apr. 6, 2017

(65) Prior Publication Data
US 2018/0268833 A1 Sep. 20, 2018

(30) Foreign Application Priority Data
Sep. 29, 2015 (CN) .......................... 2015 1 0631912

(51) Int. Cl.
*G10L 21/00* (2013.01)
*G10L 21/003* (2013.01)
*H04H 60/04* (2008.01)

(52) U.S. Cl.
CPC ............ *G10L 21/00* (2013.01); *G10L 21/003* (2013.01); *H04H 60/04* (2013.01)

(58) Field of Classification Search
None
See application file for complete search history.

(56) References Cited

U.S. PATENT DOCUMENTS 6,728,584 B1* 4/2004 Duan ..................... H04H 60/04
381/119
7,039,203 B2 5/2006 Heyl
(Continued)

FOREIGN PATENT DOCUMENTS

CN 101674450 A 3/2010
CN 101989430 A 3/2011
(Continued)

OTHER PUBLICATIONS

English machine translation of CN102610235 (Weifeng Zhao, "Sound mixing processing method, device and intelligent equipment", published Jul. 2012).*

(Continued)

*Primary Examiner* — Mark Fischer
(74) *Attorney, Agent, or Firm* — Harness, Dickey & Pierce, P.L.C.

(57) ABSTRACT

An audio-mixing processing method, an audio-mixing processing apparatus, a device, and a storage medium are provided. The method includes: extracting a signal sm(n) of a frame in a signal of a first channel and a signal vm(n) of a frame in a signal of a second channel, where the signal vm(n) corresponds to the signal sm(n), the signal of the second channel is required to be mixed with the signal of the first channel, and n represents the number of sample points; weighting the signal sm(n) and the signal vm (n), and adding the weighted signal sm(n) and the weighted signal vm(n) to acquire a mixed signal ym(n); and calculating a variable attenuation factor based on a maximum value ymax of a sequence of the mixed signal ym(n), and attenuating the (Continued)

mixed signal ym(n) by using the variable attenuation factor to generate an output signal Zm(n).

16 Claims, 4 Drawing Sheets

(56) References Cited

U.S. PATENT DOCUMENTS

| | | | |
|---|---|---|---|
| 7,379,961 B2 | 5/2008 | Matsuoka | |
| 2016/0100253 A1* | 4/2016 | Yliaho | H04R 5/02 381/306 |

FOREIGN PATENT DOCUMENTS

| | | |
|---|---|---|
| CN | 102226944 A | 10/2011 |
| CN | 102610235 A | 7/2012 |
| KR | 20030017839 A | 3/2003 |
| KR | 20090022551 A | 3/2009 |

OTHER PUBLICATIONS

International Search Report for PCT/CN2016/084718 (Chinese and English), ISA/CN, Haidian District, Beijing, dated Aug. 24, 2016.
Written Opinion of the ISA for PCT/CN2016/084718 (Chinese), ISA/CN, Haidian District, Beijing, dated Aug. 24, 2016.

* cited by examiner

SOUND-MIXING PROCESSING METHOD, APPARATUS AND DEVICE, AND STORAGE MEDIUM

This application is the national phase of International Patent Application No. PCT/CN2016/084718 filed on Jun. 3, 2016, which claims the priority to Chinese Patent Application No. 201510631912.3, titled "SOUND-MIXING PROCESSING METHOD, APPARATUS AND DEVICE", filed on Sep. 29, 2015 with the State Intellectual Property Office of People's Republic of China, both of which are incorporated herein by reference in their entireties.

TECHNICAL FIELD

The present disclosure relates to the technical field of audio-mixing, and in particular, to an audio-mixing processing method, an audio-mixing processing apparatus, a device, and a storage medium.

BACKGROUND

In a karaoke system, the most fundamental technique involves audio-mixing algorithms, which are however the most difficult matters. At present, there normally exist the following audio-mixing algorithms in the Internet and open source codes.

One audio-mixing algorithm is adding and averaging, which has a disadvantage of low volume but has an advantage of no overflow. However, overflow will occur in a case that a signal is directly multiplied by a factor for amplification.

Another audio-mixing algorithm is directly adding, which can well preserve volume, but has a disadvantage that a break is generated in a case of overflow, resulting in frequency distortion and loss of sound quality.

In yet another audio-mixing algorithm, a formula $Y=A+B-(A*B/(-(2pow(n-1)-1)))$ is used, where A and B are signals of two channels to be mixed, n is the number of sample points, and pow represents an exponentiation operation. The algorithm does not lead to overflow, but leads to weakened middle pitch. Additionally, the algorithm is not suitable for a situation where it is required to multiply A and B by an amplification factor, because the algorithm may lead to an overflow if A and B are multiplied by the amplification factor.

The above algorithms all have their disadvantages, and none of them can support the application of mixing signals of multiple channels in proportion.

SUMMARY

An audio-mixing processing method, an audio-mixing processing apparatus, a device and a storage medium are provided according to embodiments of the present disclosure, so as to address the issue that the conventional audio-mixing technologies cannot support mixing signals of multiple channels in proportion and other issues.

An audio-mixing processing method is provided according to a first aspect of the present disclosure, including:

extracting a signal sm(n) of a frame in a signal of a first channel and a signal vm(n) of a frame in a signal of a second channel, where the signal vm(n) corresponds to the signal sm(n), the signal of the second channel is required to be mixed with the signal of the first channel, and n represents the number of sample points;

weighting the signal sm(n) and the signal vm (n), and adding the weighted signal sm(n) and the weighted signal vm(n) to acquire a mixed signal ym(n); and calculating a variable attenuation factor based on a maximum value ymax of a sequence of the mixed signal ym(n), and attenuating the mixed signal ym(n) by using the variable attenuation factor to generate an output signal Zm(n).

An audio-mixing processing apparatus is provided according to a second aspect of the present disclosure, including:

an extraction module, configured to extract a signal sm(n) of a frame in a signal of a first channel and a signal vm(n) of a frame in a signal of a second channel, where the signal vm(n) corresponds to the signal sm(n), the signal of the second channel is required to be mixed with the signal of the first channel, and n represents the number of sample points;

an mixing module, configured to weight the signal sm(n) and the signal vm (n), and add the weighted signal sm(n) and the weighted signal vm(n), to acquire a mixed signal ym(n); and an attenuation processing module, configured to calculate a variable attenuation factor based on a maximum value ymax of a sequence of the mixed signal ym(n), and attenuate the mixed signal ym(n) by using the variable attenuation factor to generate an output signal Zm(n).

An computer device is provided according to a third aspect of the present disclosure, including a processor, a memory, a bus, and a communication interface.

The memory is configured to store a computer-executable instruction. The processor and the memory are connected to each other via the bus. The processor is configured to, when the computer device operates, execute the computer-executable instruction stored by the memory, so that the computer device performs following steps:

extracting a signal sm(n) of a frame in a signal of a first channel and a signal vm(n) of a frame in a signal of a second channel, where the signal vm(n) corresponds to the signal sm(n), the signal of the second channel is required to be mixed with the signal of the first channel, and n represents the number of sample points;

weighting the signal sm(n) and the signal vm (n), and adding the weighted signal sm(n) and the weighted signal vm(n) to acquire a mixed signal ym(n); and calculating a variable attenuation factor based on a maximum value ymax of a sequence of the mixed signal ym(n), and attenuating the mixed signal ym(n) by using the variable attenuation factor to generate an output signal Zm(n).

A non-volatile storage medium is provided according to a fourth aspect of the present disclosure. The non-volatile storage medium stores a computer readable instruction that, when executed by a computer, causes the computer to perform the aforementioned audio-mixing processing method.

In view of the above, according to some feasible embodiments of the present disclosure, the signals of each channel to be mixed are extracted in frames, weighted and added, and the mixed signal is attenuated by using the variable attenuation factor. Therefore, audio-mixing is achieved with the following technical effects.

In one aspect, the application of mixing signals of multiple channels in proportion is supported. For example, it is applicable to the case that volume of at least one of human voice and accompaniment is amplified by a factor of two or more.

In another aspect, the mixed signal acquired after weighting and adding is attenuated by using the attenuation factor, which can prevent a problem that the acquired output signal overflows.

In addition, by using solutions according to embodiments of the present disclosure, sound quality is well preserved with few burr noises.

BRIEF DESCRIPTION OF THE DRAWINGS

For clearer illustration of the technical solutions according to embodiments of the present disclosure or conventional techniques, hereinafter are briefly described the drawings to be used in description of embodiments of the present disclosure and conventional techniques. Apparently, the drawings in the following descriptions are only some embodiments of the present disclosure, and other drawings may be obtained by those skilled in the art based on the provided drawings without creative efforts.

DETAILED DESCRIPTION OF THE EMBODIMENTS

For those skilled in the art to better understand solutions of the present disclosure, the technical solutions according to the embodiments of the present application will be described clearly and completely as follows in conjunction with the drawings in the embodiments of the present disclosure. It is apparent that the described embodiments are only a part of the embodiments according to the present disclosure, rather than all the embodiments. Any other embodiments obtained by those skilled in the art based on the embodiments in the present disclosure without any creative efforts fall within the protection scope of the present disclosure.

A technical solution according to an embodiment of the present disclosure is applied to a karaoke system. The karaoke system includes but is not limited to a karaoke system used in KTV, a home karaoke system, and a computer device installed with karaoke software. The computer device may be one of a general-purpose computer, a client-customized machine, or a portable device such as a mobile phone terminal and a tablet machine. Generally, the karaoke system further includes an audio system and a microphone.

Specific embodiments are described in detail hereinafter.

An audio-mixing processing method is provided according to a first embodiment of the present disclosure. According to the method, signals of each channel to be mixed are extracted in frames, weighted and added, and the mixed signal is attenuated by using a variable attenuation factor, and the attenuated mixed signal serves as an output signal.

Figure 1:
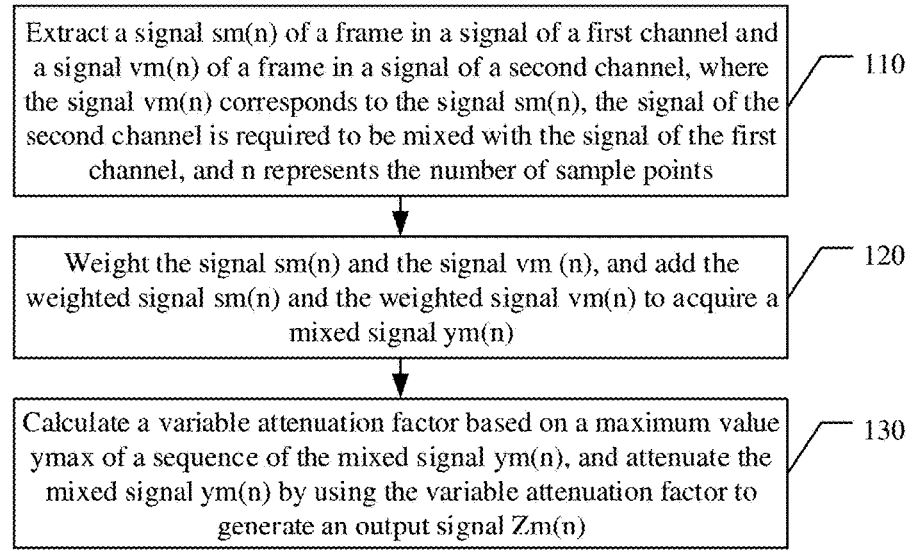
FIG. 1 is a flowchart of an audio-mixing processing method according to an embodiment of the present disclosure.

Referring to FIG. 1, the audio-mixing processing method according to an embodiment of the present disclosure includes steps 110 to 130.

In 110, a signal $sm(n)$ of a frame in a signal of a first channel is extracted, and a signal $vm(n)$ of a frame in a signal of a second channel is extracted, where the signal $vm(n)$ corresponds to the signal $sm(n)$, the signal of the second channel is required to be mixed with the signal of the first channel, and n represents the number of sample points.

Audio-mixing on the signals of the two channels is taken as an example for illustration the embodiment of the present disclosure. However, it should be noted that the number of signals of different channels is not limited in the technical solution of the present disclosure, because audio-mixing on signals of multiple channels can always be simplified as audio-mixing on signals of two channels.

When a karaoke system operates, specifically, when karaoke software installed in a computer device in the karaoke system operates, a processor of the computer device acquires the signals of the two channels to be mixed. In an embodiment of the present disclosure, $s(n)$ represents a signal of a first channel, $v(n)$ represents a signal of a second channel, where n presents the number of the sample points. For example, 1024 sample points may be included in a unit time such as one second.

In an embodiment of the present disclosure, the signals $s(n)$ and $v(n)$ of the two channels are mixed in proportion. It is assumed that the proportion is p/q, that is, the signal $s(n)$ is amplified by a factor of p and the signal $v(n)$ is amplified by a factor of q, where q and p may have any value greater than zero. Generally, p and q have values not greater than 10.

In an embodiment of the present disclosure, the signals $s(n)$ and $v(n)$ of the two channels are processed in frames. After current signal frames in the $s(n)$ and the $v(n)$ are mixed, next signal frames are mixed continuously. A frame length may be set arbitrarily, for example, a length N of a signal of a frame is set to be 1024 sample points. It should be noted that, a signal of a frame in the $s(n)$ and a signal of a frame in the $v(n)$ should have identical lengths.

For example, when signals of the m-th frame are to be mixed at a certain time, the signal $sm(n)$ of the m-th frame in the signal $s(n)$ of the first channel and the signal $vm(n)$ of the m-th frame in the signal $v(n)$ of the second channel are extracted, where the signal $vm(n)$ corresponds to the signal $sm(n)$, the signal $s(n)$ is required to be mixed with the signal $v(n)$, and m is a positive integer.

In 120, the signal $sm(n)$ and the signal $vm(n)$ are weighted, and the two weighted signals are added to acquire a mixed signal $ym(n)$.

In the step, the signals $sm(n)$ and $vm(n)$ of the two frames are respectively weighted by using weighting coefficients p and q, and the two weighted signals are added, as expressed by the following equation:

$ym(n)=p*sm(n)+q*vm(n)$, where $n=0, 1, 2, \ldots, N-1$, and N is a frame length of the signal $sm(n)$ of the frame and the signal $vm(n)$ of the frame.

In the equation, $ym(n)$ is the mixed signal acquired by weighting and adding the signals $sm(n)$ and $vm(n)$. It is understood that a length of the $ym(n)$ is identical to the length of the $sm(n)$ and the $vm(n)$, which are N, such as 1024.

In 130, a variable attenuation factor is calculated based on a maximum value ymax of a sequence of the mixed signal $ym(n)$, and the mixed signal $ym(n)$ is attenuated by using the variable attenuation factor to generated an output signal $Zm(n)$.

The mixed signal has a risk of overflow in a case of a large maximum value ymax of the mixed signal $ym(n)$. Therefore, it is not suitable to directly output $ym(n)$ as an output signal. To address the issue of overflow, in an embodiment of the present disclosure, the variable attenuation factor deta is calculated based on the maximum value ymax of the sequence of the mixed signal ym(n), and the mixed signal ym(n) is attenuated by using the variable attenuation factor deta, so that the signal ym(n) has values lower than a critical value, which also leads to a smooth data variation. It should be noted that the variable attenuation factor is variable and is calculated based on the maximum value ymax of the sequence of the ym(n) of a current frame. Therefore, values of deta are different for audio-mixing on signals of different frames.

In an embodiment of the present disclosure, a process to calculate the attenuating factor and perform the attenuation is as follows.

First, a global reference value f is defined, and the global reference value f can keep a previous value thereof. At an initial time, that is, when a signal of the first frame in the s(n) and a signal of the first frame in the v(n) are mixed, a value of f may be assigned as 1.0. When signals of other frames are processed in a following step, f is always in change, which is further illustrated hereinafter. A temporary reference value fnew is further defined herein.

In the attenuation of the ym(n), the maximum value ymax is firstly acquired as ymax=max(abs(ym)), where abs represents obtaining an absolute value, and max represents obtaining a maximum value. In addition, n takes an integer value from 0 to N−1, and ym has the maximum value when n is equal to one of the integers from 0 to N−1.

Then, ymax is compared with a preset value Ma, and the temporary reference value fnew is determined based on a comparison result. The temporary reference value is set as fnew=1.0, in a case that the maximum value ymax is not greater than the preset value Ma. The temporary reference value is set as fnew=Ma/ymax, in a case that the maximum value ymax is greater than the preset value Ma. In such case, fnew has a value slightly smaller than 1.0, and ymax multiplied by the coefficient fnew is exactly equal to Ma instead of being greater than Ma.

Generally, an audio signal is represented in 16 bites (bits), and a maximum value thereof is $2^{16}-1$, i.e., 32767. Therefore, preferably, Ma may be set as Ma=32767. In another application scene, assuming that an audio signal is represented in p bites, Ma may be set as Ma=$2^p-1$, where p may be 8, 16, 24, 32 or the like.

Then, the variable attenuation factor is calculated by using an equation deta=(f−fnew)/N, where deta represents the variable attenuation factor, and N is the frame length of the ym(n), which is 1024 herein as an example.

Then, the ym(n) is attenuated by using deta, to generate the output signal Zm(n), by using an equation Zm(n)=(f−n*deta)*ym(n), where n=0, 1, 2, . . . , N−1, and N is the frame length of the signals sm(n) and vm(n), and also is a frame length of the Zm(n). From the equation Zm(n)=(f−n*deta)*ym(n), it can be seen that signal ym(n) is limited within the critical value so as not to overflow, and data variation is relatively smooth.

For example, there is f=1.0 initially. In a case that ymax is not greater than the preset value Ma, it means that the audio signal does not overflow. At such time, fnew=1.0, then deta=0, and therefore Zm(n)=ym(n). It can be seen that because the audio signal does not overflow, the ym(n) serves as the output signal directly without being attenuated.

Finally, the global reference value f is updated to be equal to the temporary reference value fnew for processing of a signal of a next frame. For example, f is equal to an initial value 1.0 when processing a signal of the first frame, and it is assumed that fnew is equal to 0.95 at this point. Then, it is set that f=fnew=0.95 after the signal of the first frame is processed. Therefore, a current value of f is 0.95 when processing a signal of the second frame.

In the embodiment of the present disclosure, a signal of each frame is processed for audio-mixing based on the aforementioned method, until signals of all the frames are processed, thereby achieving audio-mixing in proportion.

Figure 2:
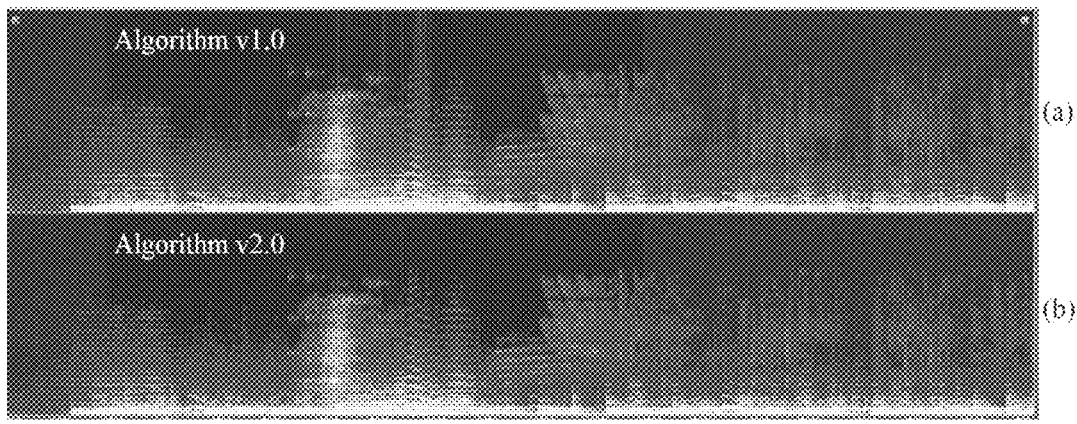
FIG. 2 is a schematic diagram of a test result.

Reference is made to FIG. 2, which is a schematic diagram of a test result, where (a) is a schematic diagram of a test result of audio-mixing by using a conventional audio-mixing technology, and (b) is a schematic diagram of a test result of audio-mixing by using the method according to an embodiment of the present disclosure. It can be seen that there are apparent burr impulses (referring to vertical lines in the figure) in (a), which represents background noises difficult to be distinguished in human ears. On the contrary, (b) is quite clean, having almost no burr noise. The test results of the algorithms show that, with the audio-mixing method according to the technical solution of the embodiment of the present disclosure, the sound quality is well preserved finally with few burr noises.

In view of the above, the audio-mixing processing method is disclosed according to some feasible embodiments of the present disclosure. In the method, the signals of each channel to be mixed are extracted in frames, weighted and added, and the mixed signal is attenuated by using the variable attenuation factor. Therefore, audio-mixing is achieved with the following technical effects.

In one aspect, the application of mixing signals of multiple channels in proportion is supported. For example, it is applicable to the case that volume of at least one of human voice and accompaniment is required to be amplified by a factor of two or more.

In another aspect, the mixed signal acquired after weighting and adding is attenuated by using the attenuation factor, which can prevent a problem that the acquired output signal overflows.

In addition, by using the audio-mixing solutions according to embodiments of the present disclosure, sound quality is well preserved with few burr noises.

For better understanding technical solutions according to embodiments of the present disclosure, description is made with reference to an exemplary embodiment in a specific scene as follows.

It is assumed that s(n) and v(n) are to be mixed in a proportion of p/q, where both p and q are greater than 0 and smaller than M, M may have any value greater than 0, and M=10 preferably.

The process includes the following steps.

First, a parameter f for keeping a previous value is set, and is initialized as 1.0 when audio-mixing starts (which is not initialized again for following frames, but keeps a previous value).

In step S1, signals sm(n) and vm(n) of the first frames are respectively extracted from the s(n) and v(n), where a frame length is arbitrarily set, and preferably set as N=1024 sample points.

In step S2, ym(n)=p*sm(n)+q*vm(n) is generated, having a length of N.

In step S3, a maximum value ymax=max(ym) of a sequence of the ym(n) is obtained.

In step S4, fnew=1.0 in a case that ymax≤32767.

In step S5, fnew=32767/ymax in a case that ymax>32767.

In step S6, deta=(f−fnew)/N is calculated.

In step S7, Zm(n)=(f−n*deta)*ym(n) is acquired, where n takes a value from 0 to N−1.

In step S8, f=fnew is set.

In step S9, zm is outputted as data of a processed frame.

In step S10, the value of f is kept for a next frame.

The second frame, the third frame, the fourth frame, . . . , are processed in sequence until all the frames are processed.

Finally the audio-mixing in proportion is completed.

For better understanding the aforementioned technical solutions according to embodiments of the present disclosure, a relevant apparatus for implementing the aforementioned technical solutions is further provided.

Figure 3:
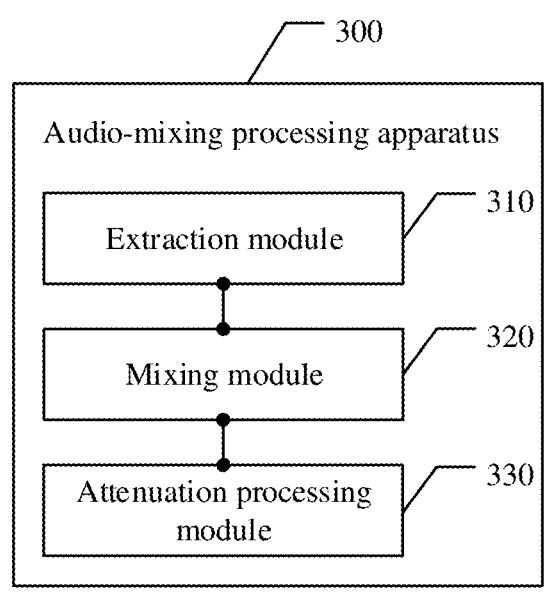
FIG. 3 is a schematic structural diagram of an audio-mixing processing apparatus according to an embodiment of the present disclosure.

Referring to FIG. 3, an audio-mixing processing apparatus is provided according to a second embodiment of the present disclosure, including an extraction module 310, a mixing module 320, and an attenuation processing module 330.

The extraction module 310 is configured to extract a signal sm(n) of a frame in a signal of a first channel and a signal vm(n) of a frame in a signal of a second channel, where the signal vm(n) corresponds to the signal sm(n), the signal of the second channel is required to be mixed with the signal of the first channel, and n represents the number of sample points.

The mixing module is configured to weight the signal sm(n) and the signal vm (n), and add the weighted signal sm(n) and the weighted signal vm(n), to acquire a mixed signal ym(n).

The attenuation processing module 330 is configured to calculate a variable attenuation factor based on a maximum value ymax of a sequence of the mixed signal ym(n), and attenuate the mixed signal ym(n) by using the variable attenuation factor to generate an output signal Zm(n).

Figure 4:
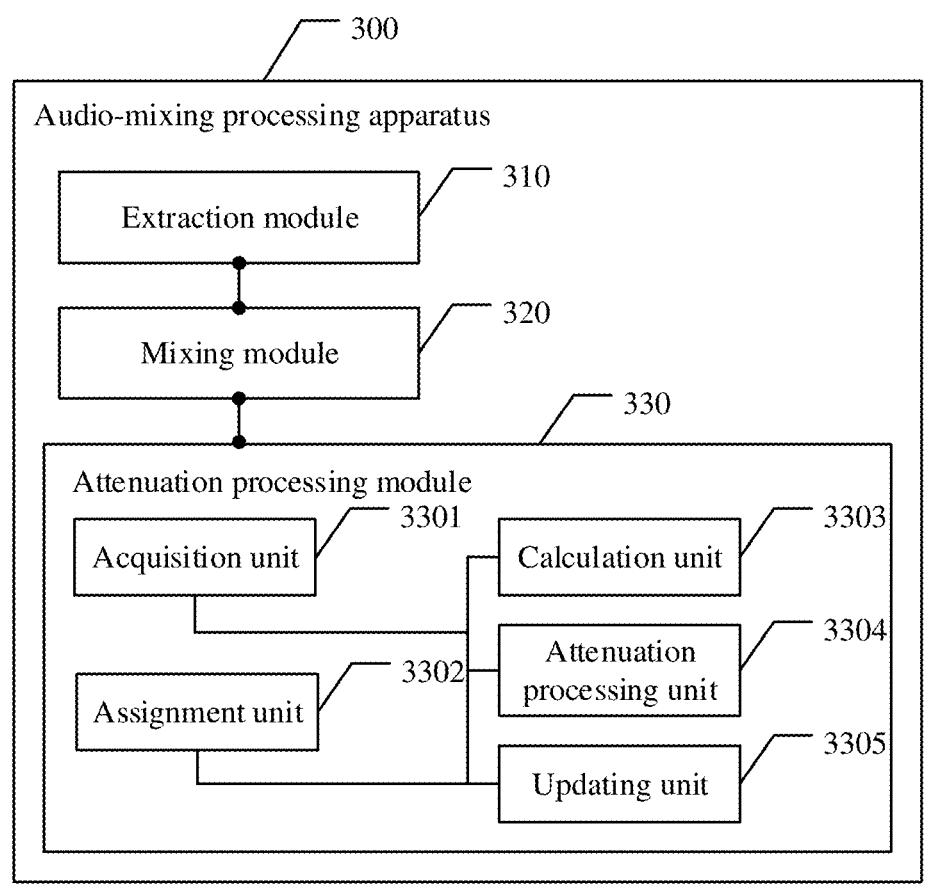
FIG. 4 is a schematic structural diagram of another audio-mixing processing apparatus according to an embodiment of the present disclosure.

Referring to FIG. 4, in some embodiments of the present disclosure, the attenuation processing module 330 includes an acquisition unit 3301, an assignment unit 3302, and a calculation unit 3303.

The acquisition unit 3301 is configured to acquire the maximum value ymax of the sequence of the ym(n) and a current global reference value f, where ymax=max(abs (ym)), abs represents obtaining an absolute value, and max represents obtaining a maximum value.

The assignment unit 3302 is configured to set a temporary reference value as fnew=1.0 in a case that the maximum value ymax is not greater than a preset value Ma, and set the temporary reference value as fnew=Ma/ymax in a case that the maximum value ymax is greater than the preset value Ma.

The calculation unit 3303 is configured to calculate the preset variable attenuation factor deta as deta=(f−fnew)/N.

Further, the attenuation processing module 330 may further include an attenuation processing unit 3304.

The attenuation processing unit 3304 is configured to attenuate the mixed signal ym(n) by using the variable attenuation factor deta to acquire the signal Zm(n) as Zm(n)=(f−n*deta)*ym(n), n=0, 1, 2, . . . , N−1, where N is a frame length of the signal sm(n) of the frame and the signal vm(n) of the frame, and the signal Zm(n) acquired after attenuation serves as the output signal.

Further, the attenuation processing module 330 further includes an updating unit 3305.

The updating unit 3305 is configured to update the global reference value f to be equal to the temporary value fnew for processing in a next frame.

Optionally, an initial value of the global reference value f is 1.0, and the preset value Ma is equal to 32767.

It is understood that a function of each functional module of the audio-mixing processing apparatus according to the embodiment of the present disclosure may be specifically implemented based on the method according to the aforementioned method embodiments. For details of the implementations, one may refer to relevant description in the aforementioned method embodiments, which is not repeated herein.

In view of the above, the audio-mixing processing apparatus is disclosed according to some feasible embodiments of the present disclosure. Based on the method, the signals of each channel to be mixed are extracted in frames, weighted and added, and the mixed signal is attenuated by using the variable attenuation factor. Therefore, audio-mixing is achieved with the following technical effects.

In one aspect, the application of mixing signals of multiple channels in proportion is supported. For example, it is applicable to the case that volume of at least one of human voice and accompaniment is amplified by a factor of two or more.

In another aspect, the mixed signal acquired after weighting and adding is attenuated by using the attenuation factor, which can prevent a problem that the acquired output signal overflows.

In addition, by using the audio-mixing solutions according to embodiments of the present disclosure, sound quality is well preserved with few burr noises.

Figure 5:
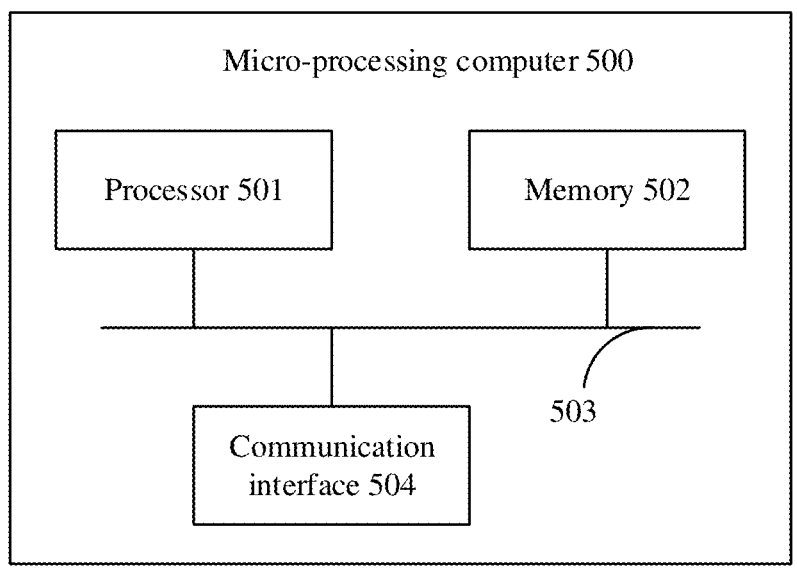
FIG. 5 is a schematic structural diagram of a computer device according to an embodiment of the present disclosure.

Referring to FIG. 5, a computer device 500 is further provided according to a third embodiment of the present disclosure, including: a processor 501, a memory 502, a bus 503, and a communication interface 504.

The memory 502 is configured to store a computer-executable instruction. The processor 501 and the memory 502 are connected to each other via the bus 503. The processor 501 is configured to, when the computer device 500 operates, execute the computer-executable instruction stored by the memory 502, so that the computer device 500 performs following steps.

In a step, signal sm(n) of a frame in a signal of a first channel and a signal vm(n) of a frame in a signal of a second channel are extracted, where the signal vm(n) corresponds to the signal sm(n), the signal of the second channel is required to be mixed with the signal of the first channel, and n represents the number of sample points.

In another step, the signal sm(n) and the signal vm (n) are weighted, and the weighted signal sm(n) and the weighted signal vm(n) are added to acquire a mixed signal ym(n).

In another step, a variable attenuation factor is calculated based on a maximum value ymax of a sequence of the mixed signal ym(n), and the mixed signal ym(n) is attenuated by using the variable attenuation factor to generate an output signal Zm(n).

In some embodiments of the present disclosure, the step of calculating the variable attenuation factor by the processor 501 based on the maximum value ymax of the sequence of the mixed signal ym(n) includes: acquiring the maximum value ymax of the sequence of the ym(n), where ymax=max (abs(ym)), abs represents obtaining an absolute value, max represents obtaining a maximum value; acquiring a current global reference value f; setting a temporary reference value as fnew=1.0 in a case that the maximum value ymax is not greater than a preset value Ma, and setting the temporary reference value as fnew=Ma/ymax in a case that the maximum value ymax is greater than the preset value Ma; and calculating the variable attenuation factor deta as deta=(f−fnew)/N.

In some embodiments of the present disclosure, the step of attenuating the mixed signal ym(n) by the processor 501 by using the variable attenuation factor to generate the output signal Zm(n) includes attenuating the mixed signal ym(n) by using the variable attenuation factor deta to acquire the signal Zm(n) as Zm(n)=(f−n*deta)*ym(n), n=0, 1, 2, . . . , N−1, where N is a frame length of the signal sm(n) of the frame and the signal vm(n) of the frame, and the signal Zm(n) acquired after attenuation serves as the output signal.

In some embodiments of the present disclosure, the processor 540 may further perform a step of updating the global reference value f to be equal to the temporary value fnew for processing of a next frame.

In some embodiments of the present disclosure, an initial value of the global reference value f is 1.0, and the preset value Ma is equal to 32767.

In view of the above, the audio-mixing processing apparatus is disclosed according to some feasible embodiments of the present disclosure. Based on the method, the signals of each channel to be mixed are extracted in frames, weighted and added, and the mixed signal is attenuated by using the variable attenuation factor. Therefore, audio-mixing is achieved with the following technical effects.

In one aspect, the application of mixing signals of multiple channels in proportion is supported. For example, it is applicable to the case that volume of at least one of human voice and accompaniment is amplified by a factor of two or more.

In another aspect, the mixed signal acquired after weighting and adding is attenuated by using the attenuation factor, which can prevent a problem that the acquired output signal overflows.

In addition, by using the audio-mixing solutions according to embodiments of the present disclosure, sound quality is well preserved with few burr noises.

A computer storage medium is further provided according to a fourth embodiment of the present disclosure. The computer storage medium stores a program, and some or all of the steps described in the aforementioned method embodiments are performed when the program is executed.

In the aforementioned embodiments, description of each embodiment has emphasis thereof. For details not described in one embodiment, one may refer to relevant description in other embodiments.

It should be noted that, for a concise description, each of the aforementioned method embodiments are described as a combination of a series of operations. However, those skilled in the art should appreciate that the present disclosure is not limited to the order of the described operations, because some of the steps may be performed in another order or at the same time according to the present disclosure. Also, those skilled in the art should appreciate that the embodiments in the description are all preferred embodiments, and an included operation or module may be optional to the present disclosure.

Those skilled in the art can appreciated that some or all of the steps in the various methods according to the aforementioned embodiments may be implemented by a program instructing relevant hardware, where the program may be stored in a computer readable storage medium, and the storage medium may include an ROM, an RAM, a magnetic disk, an optical disk, or the like.

The audio-mixing processing method, the audio-mixing processing apparatus, and the device according to embodiments of the present disclosure are introduced hereinabove in detail. The principle and implementations of the present disclosure are described herein with specific embodiments, and illustration of the aforementioned embodiments is only intended to help understand the method and the key concept of the present disclosure. For those skilled in the art, changes may be made in specific implementations and an application scope based on the concepts of the present disclosure. In summary, content of the present disclosure should not be understood as a limitation of the present disclosure.

The invention claimed is:

1. An audio-mixing processing method, comprising:
extracting a signal sm(n) of a frame in a signal of a first channel and a signal vm(n) of a frame in a signal of a second channel, wherein the signal vm(n) corresponds to the signal sm(n), the signal of the second channel is required to be mixed with the signal of the first channel, and n represents the number of sample points;
weighting the signal sm(n) and the signal vm (n), and adding the weighted signal sm(n) and the weighted signal vm(n) to acquire a mixed signal ym(n); and
calculating a variable attenuation factor based on a maximum value ymax of a sequence of the mixed signal ym(n), and attenuating the mixed signal ym(n) by using the variable attenuation factor to generate an output signal Zm(n).

2. The method according to claim 1, wherein the calculating a variable attenuation factor based on a maximum value ymax of a sequence of the mixed signal ym(n) comprises:
acquiring the maximum value ymax of the sequence of the ym(n) and a current global reference value f, wherein ymax=max(abs(ym)), abs represents obtaining an absolute value, and max represents obtaining a maximum value;
setting a temporary reference value as fnew=1.0 in a case that the maximum value ymax is not greater than a preset value Ma, and setting the temporary reference value as fnew=Ma/ymax in a case that the maximum value ymax is greater than the preset value Ma; and
calculating the variable attenuation factor deta as deta=(f−fnew)/N, wherein N is a frame length of the signal sm(n) of the frame and the signal vm(n) of the frame.

3. The method according to claim 2, wherein the attenuating the mixed signal ym(n) by using the variable attenuation factor to generate an output signal Zm(n) comprises:
attenuating the mixed signal ym(n) by using the variable attenuation factor deta to acquire the signal Zm(n) as Zm(n)=(f−n*deta)*ym(n), n=0, 1, 2, . . . , N−1, wherein N is a frame length of the signal sm(n) of the frame and the signal vm(n) of the frame, and the signal Zm(n) acquired after attenuation serves as the output signal.

4. The method according to claim 3, further comprising:
updating the global reference value f to be equal to the temporary value fnew for processing of a next frame.

5. The method according to claim 4, wherein:
an initial value of the global reference value f is 1.0, and the preset value Ma is equal to 32767.

6. The method according to claim 3, wherein:
an initial value of the global reference value f is 1.0, and the preset value Ma is equal to 32767.

7. The method according to claim 2, wherein:
an initial value of the global reference value f is 1.0, and the preset value Ma is equal to 32767.

8. An audio-mixing processing apparatus, comprising:
an extraction module, configured to extract a signal sm(n) of a frame in a signal of a first channel and a signal vm(n) of a frame in a signal of a second channel, wherein the signal vm(n) corresponds to the signal sm(n), the signal of the second channel is required to be mixed with the signal of the first channel, and n represents the number of sample points;

an mixing module, configured to weight the signal sm(n) and the signal vm (n), and add the weighted signal sm(n) and the weighted signal vm(n), to acquire a mixed signal ym(n); and an attenuation processing module, configured to calculate a variable attenuation factor based on a maximum value ymax of a sequence of the mixed signal ym(n), and attenuate the mixed signal ym(n) by using the variable attenuation factor to generate an output signal Zm(n).

9. The apparatus according to claim 8, wherein the attenuation processing module comprises:

an acquisition unit, configured to acquire the maximum value ymax of the sequence of the ym(n) and a current global reference value f, wherein ymax=max(abs(ym)), abs represents obtaining an absolute value, and max represents obtaining a maximum value;

an assignment unit, configured to set a temporary reference value as fnew=1.0 in a case that the maximum value ymax is not greater than a preset value Ma, and set the temporary reference value as fnew=Ma/ymax in a case that the maximum value ymax is greater than the preset value Ma; and a calculation unit, configured to calculate the preset variable attenuation factor deta as deta=(f−fnew)/N, wherein N is a frame length of the signal sm(n) of the frame and the signal vm(n) of the frame.

10. The apparatus according to claim 9, wherein the attenuation processing module further comprises:

an attenuation processing unit, configured to attenuate the mixed signal ym(n) by using the variable attenuation factor deta to acquire the signal Zm(n) as Zm(n)=(f−n*deta)*ym(n), n=0, 1, 2, . . . , N−1, wherein N is a frame length of the signal sm(n) of the frame and the signal vm(n) of the frame, and the signal Zm(n) acquired after attenuation serves as the output signal.

11. The apparatus according to claim 10, wherein:
an initial value of the global reference value f is 1.0, and the preset value Ma is equal to 32767.

12. The apparatus according to claim 9, wherein the attenuation processing module further comprises:

an updating unit, configured to update the global reference value f to be equal to the temporary value fnew for processing of a next frame.

13. The apparatus according to claim 9, wherein:
an initial value of the global reference value f is 1.0, and the preset value Ma is equal to 32767.

14. The apparatus according to claim 9, wherein:
an initial value of the global reference value f is 1.0, and the preset value Ma is equal to 32767.

15. A computer device, comprising:
a processor,
a memory,
a bus, and
a communication interface, wherein
the memory is configured to store a computer-executable instruction,
the processor and the memory are connected to each other via the bus, and
the processor is configured to, when the computer device operates, execute the computer-executable instruction stored by the memory, to cause the computer device to perform following steps:

extracting a signal sm(n) of a frame in a signal of a first channel and a signal vm(n) of a frame in a signal of a second channel, wherein the signal vm(n) corresponds to the signal sm(n), the signal of the second channel is required to be mixed with the signal of the first channel, and n represents the number of sample points;

weighting the signal sm(n) and the signal vm (n), and adding the weighted signal sm(n) and the weighted signal vm(n) to acquire a mixed signal ym(n); and calculating a variable attenuation factor based on a maximum value ymax of a sequence of the mixed signal ym(n), and attenuating the mixed signal ym(n) by using the variable attenuation factor to generate an output signal Zm(n).

16. A non-volatile storage medium, storing one or more computer programs, wherein the one or more computer programs comprise an instruction executable by a processor having one or more memories, and the instruction, when executed by a computer, causes the computer to perform following steps:

extracting a signal sm(n) of a frame in a signal of a first channel and a signal vm(n) of a frame in a signal of a second channel, wherein the signal vm(n) corresponds to the signal sm(n), the signal of the second channel is required to be mixed with the signal of the first channel, and n represents the number of sample points;

weighting the signal sm(n) and the signal vm (n), and adding the weighted signal sm(n) and the weighted signal vm(n) to acquire a mixed signal ym(n); and calculating a variable attenuation factor based on a maximum value ymax of a sequence of the mixed signal ym(n), and attenuating the mixed signal ym(n) by using the variable attenuation factor to generate an output signal Zm(n).

* * * * *